US010867735B1

(12) United States Patent
Garampazzi et al.

(10) Patent No.: US 10,867,735 B1
(45) Date of Patent: Dec. 15, 2020

(54) INDUCTORS WITH COMPENSATED ELECTROMAGNETIC COUPLING

(71) Applicant: INPHI CORPORATION, Santa Clara, CA (US)

(72) Inventors: Marco Garampazzi, Santa Clara, CA (US); Matteo Pisati, Santa Clara, CA (US)

(73) Assignee: INPHI CORPORATION, San Jose, CA (US)

( * ) Notice: Subject to any disclaimer, the term of this patent is extended or adjusted under 35 U.S.C. 154(b) by 0 days.

(21) Appl. No.: 16/811,946

(22) Filed: Mar. 6, 2020

(51) Int. Cl.
*H04B 1/38* (2015.01)
*H04L 5/16* (2006.01)
*H01F 17/00* (2006.01)
*H03B 5/12* (2006.01)
*H04B 1/40* (2015.01)

(52) U.S. Cl.
CPC .......... *H01F 17/0013* (2013.01); *H03B 5/12* (2013.01); *H04B 1/40* (2013.01); *H01F 2017/002* (2013.01); *H01F 2017/008* (2013.01); *H01F 2017/0073* (2013.01)

(58) Field of Classification Search
CPC .......... H01F 17/0013; H01F 2017/008; H01F 2017/002; H01F 2017/0073; H03B 5/12; H03B 5/1212; H04B 1/40; H04B 1/38; H01L 27/08; H04L 7/0062
USPC ............... 375/219, 220, 316, 346, 284, 285
See application file for complete search history.

(56) References Cited

U.S. PATENT DOCUMENTS

| | | | |
|---|---|---|---|
| 2006/0033602 A1* | 2/2006 | Mattsson | H01L 27/08 336/200 |
| 2016/0277219 A1* | 9/2016 | Venkatram | H04L 7/0062 |
| 2019/0198602 A1* | 6/2019 | Liu | H03B 5/1212 |

\* cited by examiner

*Primary Examiner* — Phuong Phu
(74) *Attorney, Agent, or Firm* — Richard T. Ogawa; Ogawa P.C.

(57) ABSTRACT

The present invention is directed to electrical circuits. and more specially, inductor designs that reduce on-chip electromagnetic coupling in certain applications. In a specific embodiment, the present invention provides an inductor that includes coils that are configured to generate magnetic fields of opposite polarities. The electromagnetic fields generated by the inductor coils substantially cancel out with each other, thereby minimizing parasitic inductance of the inductor and reducing interference with operations of other components in an integrated circuit. There are other embodiments as well.

13 Claims, 11 Drawing Sheets

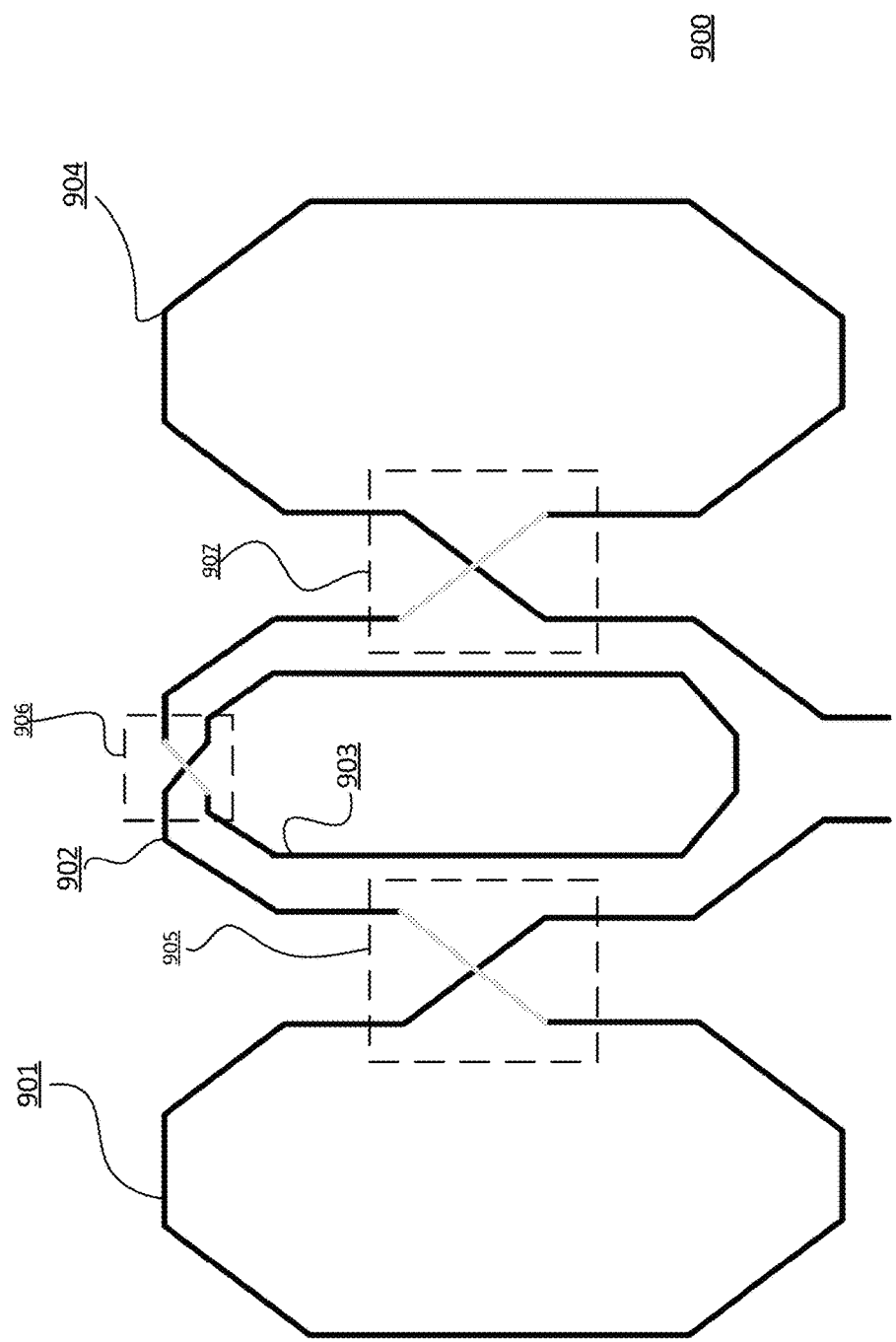

INDUCTORS WITH COMPENSATED ELECTROMAGNETIC COUPLING

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits.

Inductors, as basic components of electrical devices, have a wide of applications. Depending on the applications, inductors can be implemented in different ways to satisfy the desired performance requirement. For example, when inductors are used as certain components of RF receivers, there are certain desired characteristics for these inductors (such as inductance and electromagnetic field). Radio frequency (RF) transceivers can be implemented on a single semiconductor die or chip. Integrating a complete RF transceiver on a single chip presents a number of challenges. RF transceivers are typically implemented with, among other components, CMOS based voltage-controlled oscillators (VCO). One of challenges is integrating multiple LC-VCOs configured to provide reference clock signals at different frequencies. The performance of an LC-VCO circuit depends on both its configuration and components, and one of the important components is the inductors.

Unfortunately, existing inductors, as used in communication applications (e.g., as implemented in VCO circuits) are inadequate. Improved inductor designs and implementation are desired.

BRIEF SUMMARY OF THE INVENTION

The present invention is directed to electrical circuits. and more specially, inductor designs that reduce on-chip electromagnetic coupling in certain applications. In a specific embodiment, the present invention provides an inductor that includes coils that are configured to generate magnetic fields of opposite polarities. The electromagnetic fields generated by the inductor coils substantially cancel out with each other, thereby minimizing parasitic inductance of the inductor and reducing interference with operations of other components in an integrated circuit. There are other embodiments as well.

According to an embodiment, the present invention provides an inductor that includes a main coil configured to direct a current in a first direction to generate a first electromagnetic field. The main coil has a first winding configured to direct the current in the first direction. The main coil further includes a second winding connected in series to the first winding. The second winding is configured to direct the current in the first direction. The inductor also includes a first side coil coupled to the main coil at a first side. The first side coil is configured to direct the current in a second direction to generate a second electromagnetic field. The inductor further includes a second side coil couple to the main coil at a second side that is opposite to the first side. The first side coil is configured to direct the current in the second direction to generate a third electromagnetic field.

According to another embodiment, the present invention provides an electronic circuit, which includes a transmitter. The circuit also includes a first inductor connected to the transmitter, the first inductor comprising. The circuit further includes a main coil configured to direct a current in a first direction to generate a first electromagnetic field. The main coil includes a first winding configured to direct the current in the first direction. The main coil also includes a second winding connected in series to the first winding, the second winding configured to direct the current in the first direction. The circuit additionally includes a first side coil coupled to the main coil at a first side. The first side coil is configured to direct the current in a second direction to generate a second electromagnetic field. The circuit also has a second side coil couple to the main coil at a second side, opposite to the first side. The first side coil is configured to direct the current in the second direction to generate a third electromagnetic field. The circuit further includes a receiver. The circuit includes a second inductor connected to the receiver. The second inductor is electromagnetically coupled to the first inductor.

According to yet another embodiment, the present invention provides a voltage-controlled oscillator device, which includes an input voltage. The device also includes a first inductor including a first array of coils, which has a first coil and a second coil. The first coil and the second coil are coupled to each with a first crossover connection. the first coil and the second coil are characterized by substantially opposite electromagnetic field directions. The device also includes a second inductor coupled to the first input voltage and the first inductor. The device further includes a first capacitor configured in parallel relative to the first inductor and the second inductor. The device additionally includes a first transistor comprising a first drain and a first gate. The first drain is coupled to the first inductor and the first capacitor. The device additionally includes a second transistor comprising a second drain and a second gate. The second drain is coupled to the second inductor and the second gate. The second gate is coupled to the first drain and the first inductor.

According to yet another embodiment, the present invention provides a serializer/deserializer (SerDes) apparatus, which includes a transmitter section and a receiver section. The receiver section includes an input terminal configured for receiving an input data stream. The receiver section also includes an equalizer configured for equalizing the input data stream. The receiver section further includes a sampler configured for generating a sampled data stream using the equalized data stream and a first clock signal. The receiver section additionally includes a first voltage-controlled oscillator (VCO) configured for generating the first clock signal. The first VCO includes a first inductor including a first array of coils. The first array of coils includes a first coil and a second coil. The first coil and the second coil are coupled to each with a first crossover connection. The first coil and the second coil are characterized by substantially opposite electromagnetic field directions.

According to yet another embodiment, the present invention provides an inductor that includes a main coil configured to direct a current in a first direction to generate a first electromagnetic field. The inductor also includes a first side coil coupled to the main coil at a first side. The first side coil is configured to direct the current in a second direction to generate a second electromagnetic field. The inductor also includes a second side coil couple to the main coil at a second side positioned opposite to the first side. The first side coil is configured to direct the current in the second direction to generate a third electromagnetic field. The inductor further includes an inner coil configured to direct the current in the second direction, the inner coil being positioned inside the main coil.

It is to be appreciated that embodiments of the present invention provide many advantages over conventional techniques. Among other things, by arranging inductors in an array configuration, the undesired electromagnetic field is reduced and even eliminated, thereby improving inductor performance. When inductors are used in VCOs, the reduction or elimination of their electromagnetic fields improves the performance of VCOs. Since inductors are generally implemented on integrated circuits, on which there are metal components, reduction of inductor electromagnetic field also reduces undesired coupling between the inductors and the metal components. There are other benefits as well.

Embodiments of the present invention can be implemented in conjunction with existing systems and processes. For example, inductors according to the present invention, with coils arranged in array, can be manufactured using existing semiconductor manufacturing equipment and processes. In addition, inductors described in the present disclosure can be used in a variety of existing devices (e.g., VCO, SerDes, etc.) in places of conventional inductors, providing substantial inductor performance with reduced electromagnetic interference.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 8 is a simplified diagram illustrating an inductor circuit 900 with an inner loop according to embodiments of the present invention.

DETAILED DESCRIPTION OF THE INVENTION

Figure 1A:
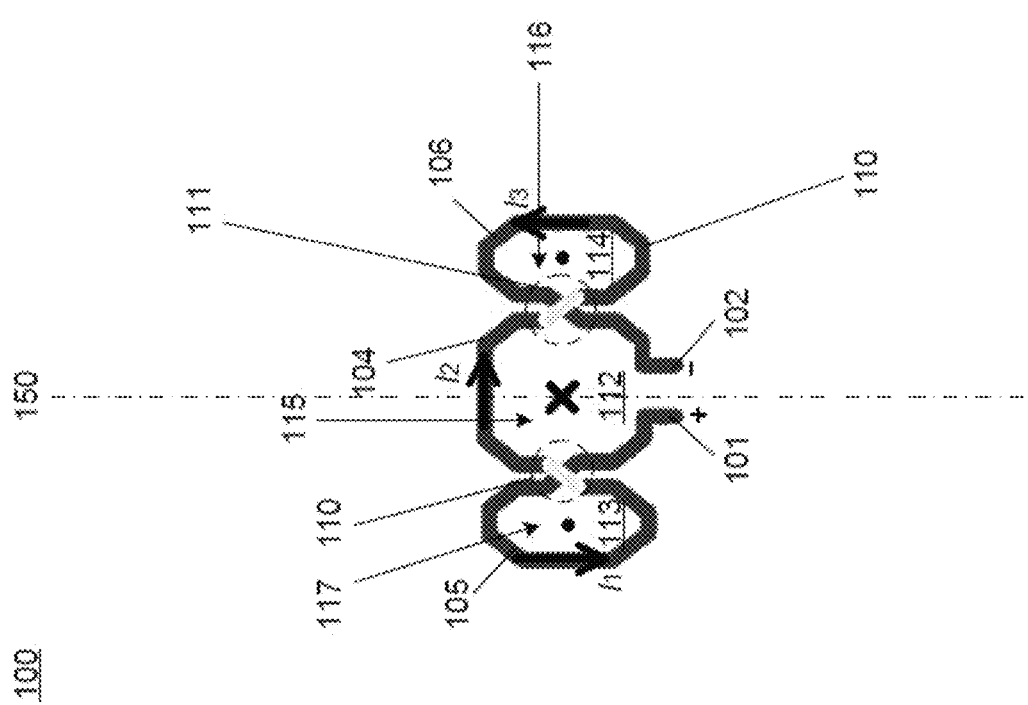
FIGS. 1A and 1B are simplified diagrams illustrating an inductor 100 according to embodiments of the present invention.

The present invention is directed to electrical circuits. and more specially, inductor designs that reduce on-chip electromagnetic coupling in a variety of applications. In a specific embodiment, the present invention provides an inductor that includes coils that are configured to generate magnetic fields of opposite polarities. The electromagnetic fields generated by the inductor coils substantially cancel out with each other, thereby minimizing parasitic inductance of the inductor and reducing interference with operations of other components in an integrated circuit. There are other embodiments as well.

As explained above, existing inductors for VCO circuits are inadequate. An LC-VCO device usually includes inductors configured near one another. The proximity of the inductors deployed at the LC-VCOs may produce undesired electromagnetic field. This undesired electromagnetic field often brings high-clock interference that disrupts the operation of RF transceivers. Moreover, the inductors of the LC-VCO may additionally couple with metal material (e.g., a metal trace) that is in close proximity to the inductor, and the coupling between the inductors and the metal also causes undesirable interference.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1B:
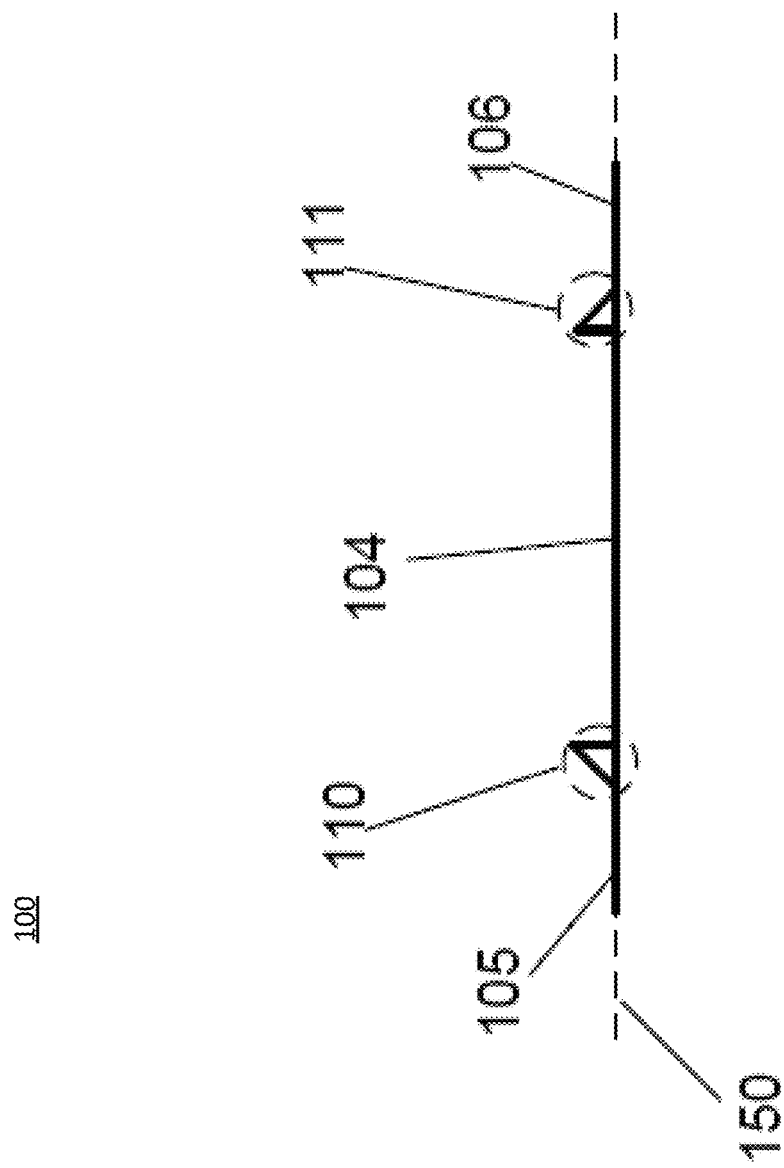

FIGS. 1A and 1B are simplified diagrams illustrating an inductor 100 according to embodiments of the present invention. These diagrams merely provide an example, which should not unduly limit the scope of the claims. One of ordinary skill in the art would recognize many variations, alternatives, and modifications. Inductor 100 includes coils 104, 105, and 106 configured as shown. For example, the plurality of coils 104-106 can be described as an array configuration, and together they provide a compensated inductive element that can be implemented into circuits such as VCO. The array configuration allows for cancelation of undesirable electromagnetic field. For example, a coil includes a conductive strip wound into a geometric shape (e.g., curvilinear, square, hexagon, octagon, circular, etc.) that is at least partially enclosed. The conductive strip can be made of a metal (e.g., aluminum, copper, gold, tungsten, platinum) or an alloy that is a combination of the metal and another material. In various embodiments, coils 104-106 are manufactured as parts of an integrated circuit. Depending on the manufacturing process, coils 104-106 can be made from one conductive strip or multiple conductive strips.

Coils 104-106 are configured in proximity to each other such that the electromagnetic (EM) fields generated by the coils 104-106 substantially overlap and cancel out with each other. Coils 104-106 are configured in different directions to allow for EM cancellation. For example, coils 104-106 are configured to direct the current to flow through the coil 104 and through the coils 105-106 in opposite directions. As illustrated, assuming that the terminal 101 is coupled to a positive voltage and terminal 102 is coupled to a negative voltage, the current flows through the coils 105 and 106 in the counter-clockwise direction whereas the current flows through the coil 104 in the clockwise direction. The current flowing through the coil 102 produces an electromagnetic field 112 in the direction going into the paper (denoted by X, as the direction of the EM field vector follows the right hand rule) and the current flowing through the coils 105-106 produces electromagnetic fields 113-114 in the direction coming out of the paper (denoted by •). The coil 104 can also be referred herein as the positive coil and the coils 105-106 are also referred herein as the negative coils The positive coil 104 produces the electromagnetic field 112, and its polarity is opposite to the polarity of the electromagnetic fields 113-114 produced by the negative coils 105-106. The electromagnetic field 112 and the electromagnetic fields 113-114 are in opposite directions in the vicinity of the conductive strip 110. In those regions such as regions 115-117, a total electromagnetic field is the difference between the electromagnetic fields 113-114 and the electromagnetic field 112. In certain embodiments, the electromagnetic fields 113-114 and the electromagnetic field 112 have substantially the same magnitude, and as a result, the electromagnetic fields 113-114 substantially cancel out the electromagnetic field 112.

The shapes, dimensions, and/or the relative locations of the coils 104-106 are configured such that the electromagnetic fields 112-114 cancel out with each other, for example, particularly in areas where parasitic inductance is undesirable, such as in areas where the electromagnetic field of another inductor (or parasitic inductor) is present. In the illustrated example, the coils 105-106 have substantially the same dimension and are positioned on the left side and on the right side of the coil 104 symmetrically with respect to the central axis 150 of the differential inductor 100. The central axis 150 is also the central axis of the coil 104. The centers of the coils 105-106 are separated from the center of the coil 104 by substantially the same distance.

In certain embodiments, the coils 105-106 are configured with substantially similarly shapes and each has a dimension that is half of the dimension of the coil 104. In a specific embodiment, coils 105-106 may have different shapes or dimensions. A total area of the coils 105-106 can be substantially the same as or different from an area of the coil 104. A ratio between the area of coil 104 to the total area of coil 105-106 and a relative position between the coils 104-106 can be adjusted to substantially reduce electromagnetic field of the inductor 100 at a particular location. The shapes of the coils may be adjusted to substantially reduce electromagnetic field of the inductor 100 at a particular location.

According to the embodiment illustrated in FIG. 1A, coils 104-106 are made of one conductive strip 110. The conductive strip 110 overlaps itself in the regions 110 and 111 (for crossover wiring). In various embodiments, the overlapping portions of the conductive strip 110 are separated by an insulating material such as silicon oxide or other forms of oxide. The overlapping arrangement of conductive strips at regions 101 and 111 allows for wire crossover for currents at different coils to flow in different directions. The crossover of wire may, in certain circumstances, lead to a slight but acceptable degradation in inductor performance. For example, inductor 100 (configured at about 260 pH inductance) may have a quality factor of about 10.5 at 14 GHz, while a conventional inductor with about the same inductance size at the same frequency may have a quality factor of about 12, and the difference in quality factor value can be attributed to the crossover regions of inductor 100.

As illustrated in FIG. 1B, the bottom surfaces of the coils 104-106 are aligned and positioned on the same plane 150. Coils 104-106 are made of one conductive strip 110 of which the thickness is consistent. As a result, the top surfaces of the coils 104-106 are aligned except for the regions 110 and 111 where the conductive strip 100 overlaps itself. Coils 104-106 may be positioned on different layers of a chip. That is, different metal layers of the chip can be used for creating coils of the inductor 100. Coils 104-106 can be made of one consecutive conductive strip 110. Depending on the implementation, coils 104-106 can also be made of separate strips that each create one coil. Coils 104-106 can each include multiple turns. Compared to certain conventional inductors of the same inductance value, inductor 100 provides EM compensation without increasing device area.

It is to be understood that by using an array of coils, the amount of EM coupling cancellation can be adjusted based on the specific application needs. For example, the relative sizes of coils 104-106 can be modified to substantially eliminate EM coupling cancellation, but in certain implementations, EM coupling is not completely eliminated, and the small but non-zero residual EM coupling attributed to coils 104-106 area tolerable (and even desirable) in various scenarios.

The performance characteristics of inductor 100 depend on various factors. For example, when as components for VCOs, the coils arranged as an array effectively can form an accumulative dipole where the net EM field is zero or very close to zero. In certain applications, the reduction in EM field is close can be as high as 15 to 30 dB when operating at a frequency range from 10 GHz to 30 GHz.

Figure 2A:
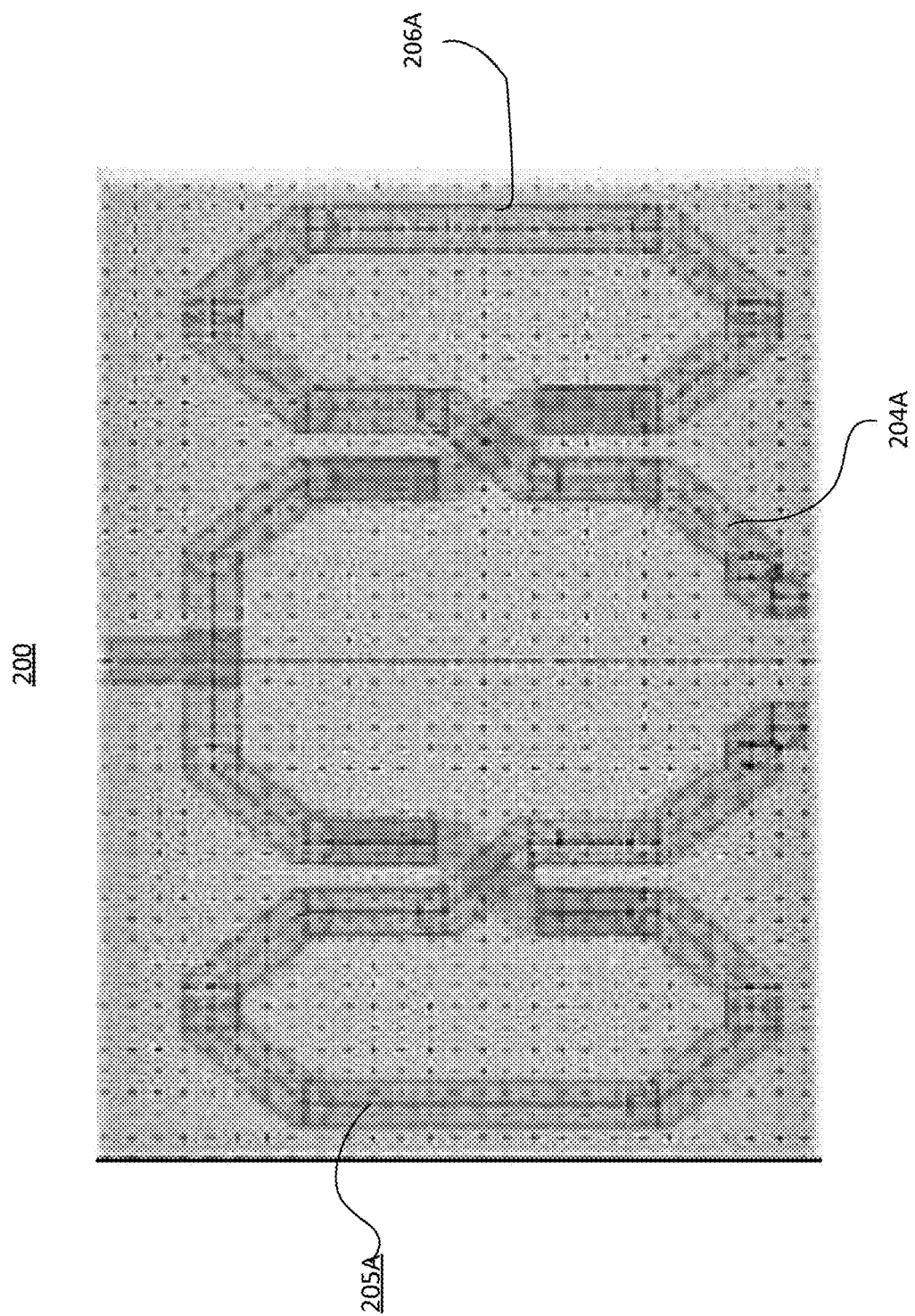
FIG. 2A shows an inductor device 200 according to an embodiment of the present invention.
Figure 2B:
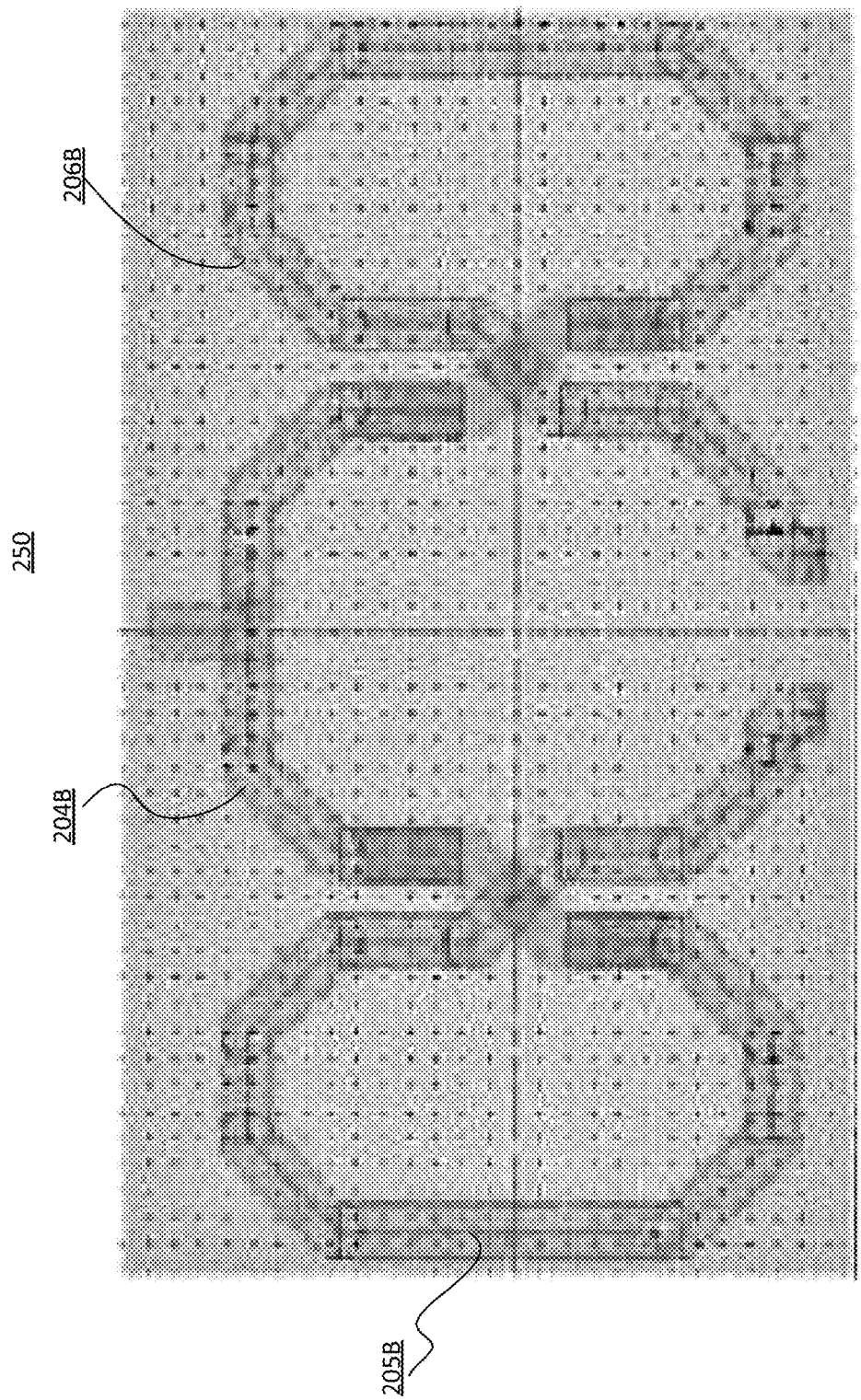
FIG. 2B shows an inductor device 250 according to an embodiment of the present invention.

FIGS. 2A and 2B illustrate two example differential inductors 200 and 250, respectively. These diagrams merely provide an example, which should not unduly limit the scope of the claims. One of ordinary skill in the art would recognize many variations, alternatives, and modifications. For example, differential inductors 200 and 250 can be implemented to have substantially the same inductance. Differential inductor 200 has three coils: a positive coil 204A and two negative coils 205A, 206A (e.g., "positive" and "negative" coils refer to the direction of current flow). Differential inductor 250 has three coils: a positive coil 204B and two negative coils 205B, 206B. As can be seen as different shapes, the total area of the differential inductor 200 is slightly bigger than the total area of the differential inductor 250. However, differential inductors 200 and 250 have different area ratios between positive coils to negative coils. That is, the area ratio of the positive coil 204A to the negative coils 205A (and/or 206A) is different from the area ratio of the positive coil 204B to the negative coils 205B (and/or 206B). The area ratio can be adjusted according to a location of an area where no electromagnetic field is desired.

Figure 3:
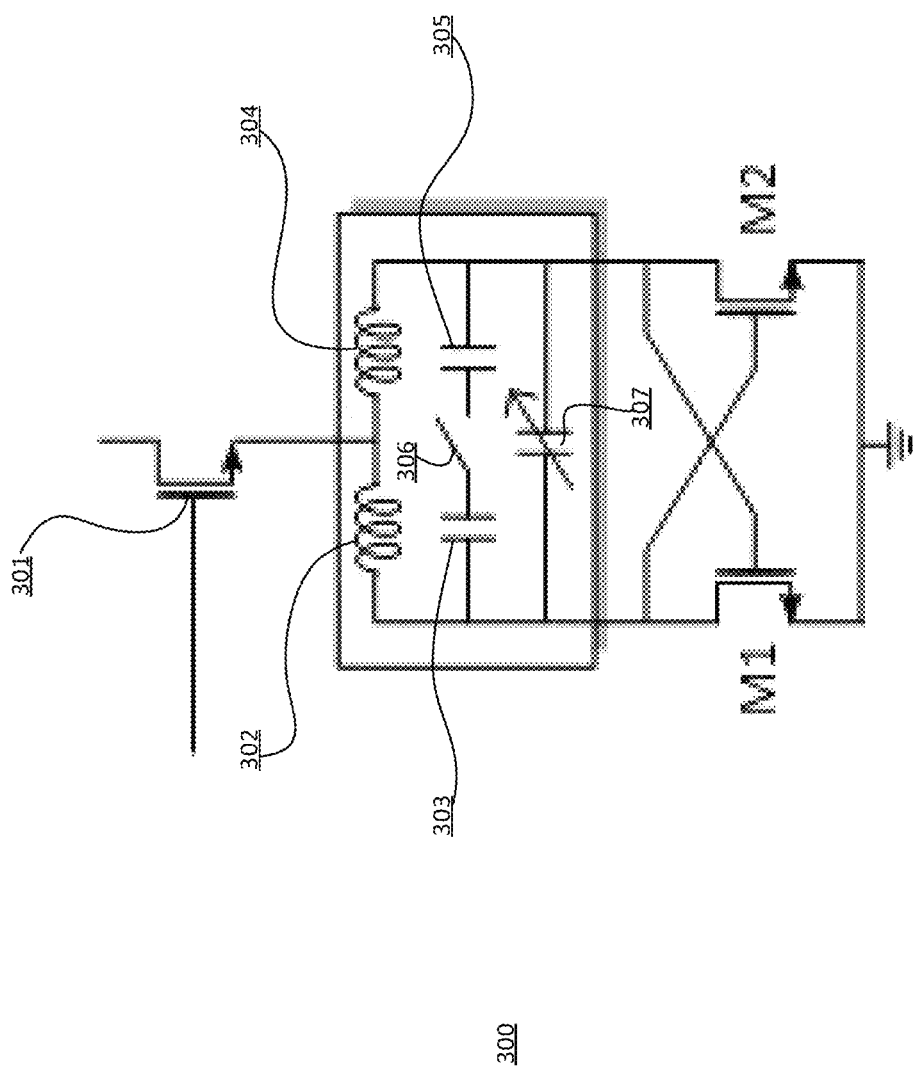
FIG. 3 is a simplified diagram illustrating inductors used in a voltage-controlled oscillator 300 according to embodiments of the present invention.

FIG. 3 is a simplified diagram illustrating inductors used in a voltage-controlled oscillator 300 according to embodiments of the present invention. This diagram is merely an example, which should not unduly limit the scope of the claims. One of ordinary skill in the art would recognize many variations, alternatives, and modifications. It is to be appreciated that inductors according to embodiments of the present invention can be utilizes in different types of VCOs, and VCO 300 is one of the exemplary VCOs. The supply voltage is received from switch 301, which is coupled to inductor 302 and inductor 304. For example, inductors 302 and 304 are implemented using inductors with EM cancellation, such as inductor 100 described above. Inductors 302 and 304 are configured in parallel with capacitors 303 and 305. For example, these inductors and capacitors are sometimes referred to as tank inductors and tank capacitors, as their sizes are selected based on the desired operating frequency. Capacitor 307 is a variable capacitor, and it is also configured in parallel relative to inductors 302 and 304, and to capacitors 303 and 305. It is also to be noted that switch 306 is configured between capacitors 303 and 305. By adjusting capacitor 307 and/or operating switch 306, capacitance at VCO 300 can be adjusted, thereby allowing adjustment of VCO frequency. Switches M1 and M2 are configured in a cross-over configuration: outputs of VCO 300 are respectively coupled to drain terminals of M1 and M2, and the drain terminals of M1 and M2 are coupled to the gate terminals of each other, as illustrated in FIG. 3. For example, switches M1 and M2 are implemented using CMOS transistors, but it is understood that other configurations are possible as well.

It is to be appreciated that VCO 300, implemented with EM compensated inductors, can generate clean clock signals. When multiple VCOs are used in an apparatus (e.g., in a SerDes) for the purpose of generating multiple and different clock signals, the cancellation of EM fields significantly reduces undesired crosstalk and improves performance. For integrated circuits where there are multiple devices (and multiple inductors), the reduction of EM field crosstalk allows for a high level of performance enhancement.

Figure 4:
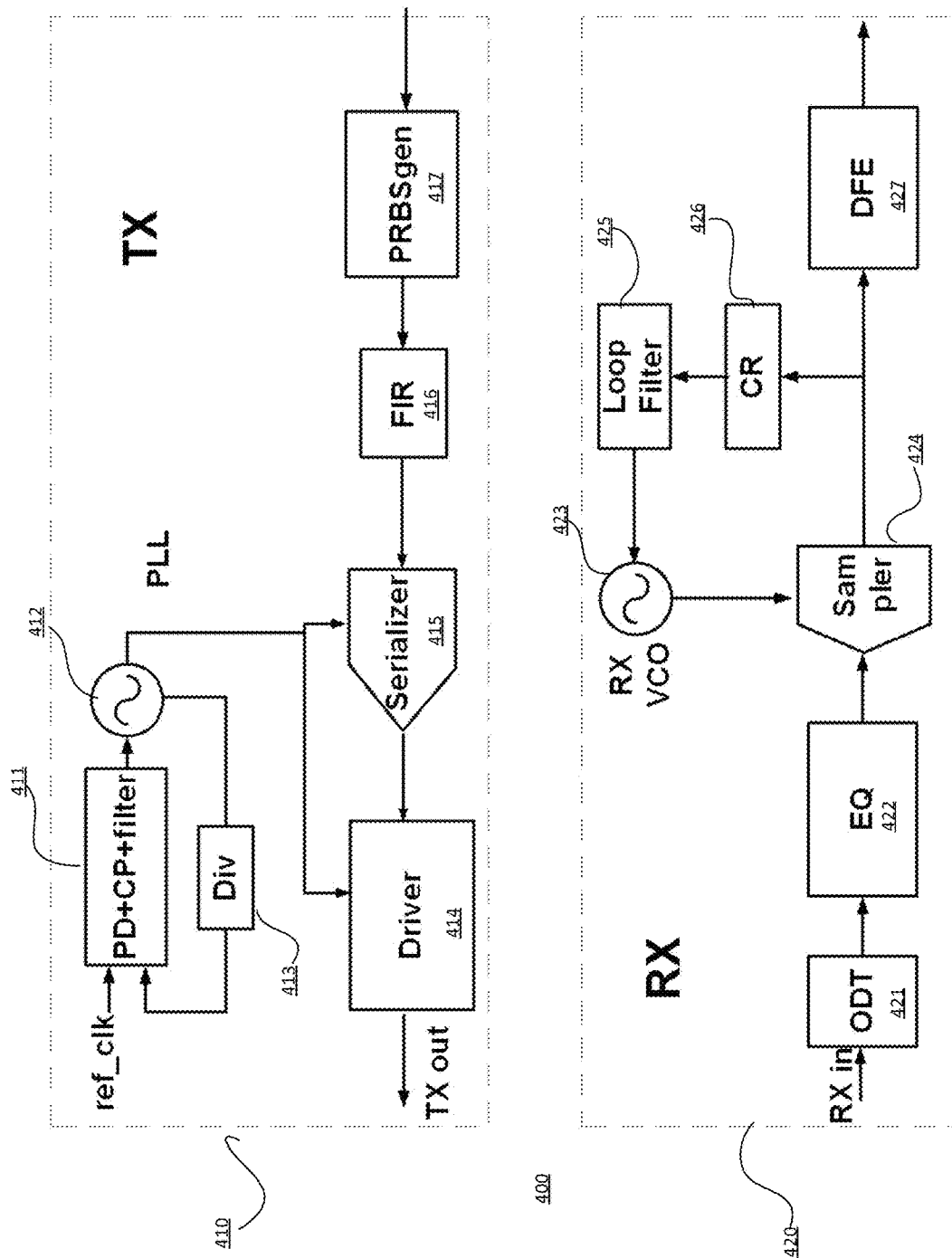
FIG. 4 is a block diagram illustrating SerDes apparatus 400 that incorporates inductors according to embodiments of the present invention.

FIG. 4 is a block diagram illustrating a SerDes apparatus 400 that incorporates inductors according to embodiments of the present invention. This diagram is merely an example, which should not unduly limit the scope of the claims. One of ordinary skill in the art would recognize many variations, alternatives, and modifications. It is to be understood that serializer/deserializer (Serdes) may be implemented in many ways. An exemplary SerDes 400 includes a transmission (TX) section 410 and a receiving (RX) section 420. RX section 420 receives data at block 421. For example, block 421 comprises on-die termination (ODT) terminal receiving data, and the ODT terminal may be digitally controlled. Block 422, which may include an equalizer (EQ), equalizes the received data. Sampler at block 424 samples receives data, and the sample data are processed by the decision feedback equalizer 427. The data sampled, filtered at block 426 and 425, by block 424 are also used to generated clock signal by VCO 423. For example, VCO 423 includes one or more compensated inductors according to embodiments of the present invention. In various embodiments, VCO 423 is implemented using the VCO 300 illustrated in FIG. 3.

The transmission section 410 includes a data stream that is to be transmitted. For example, the data stream may be provided at block 417, which comprises a pseudo random binary sequence (PRBS). The data stream is filtered at block 416, by a finite impulse response (FIR) filter. The filtered data is then processed by block 415, which serialized data for data transmission. Block 414, which includes a driver, generates an output data stream using the serial data and a clock signal. As shown in FIG. 4, the clock signal is generated by a phase-lock loop, which includes block 411-413. Block 411 receives a reference clock signal (ref_clk), and it includes a phase detector (PD), a charge pump (CP), and a filter. VCO 412 uses the output of block 411 to generate a clock signal. For example, VCO 412 includes one or more compensated inductors according to embodiments of the present invention. In a specific embodiment, inductors in VCO 412 are configured to reduce its EM interference. In various embodiments, VCO 412 is implemented using the VCO 300 illustrated in FIG. 3. The output of VCO 412 is also used by clock divider at block 413, which forms a part of the feedback loop for the PLL.

Figure 5:
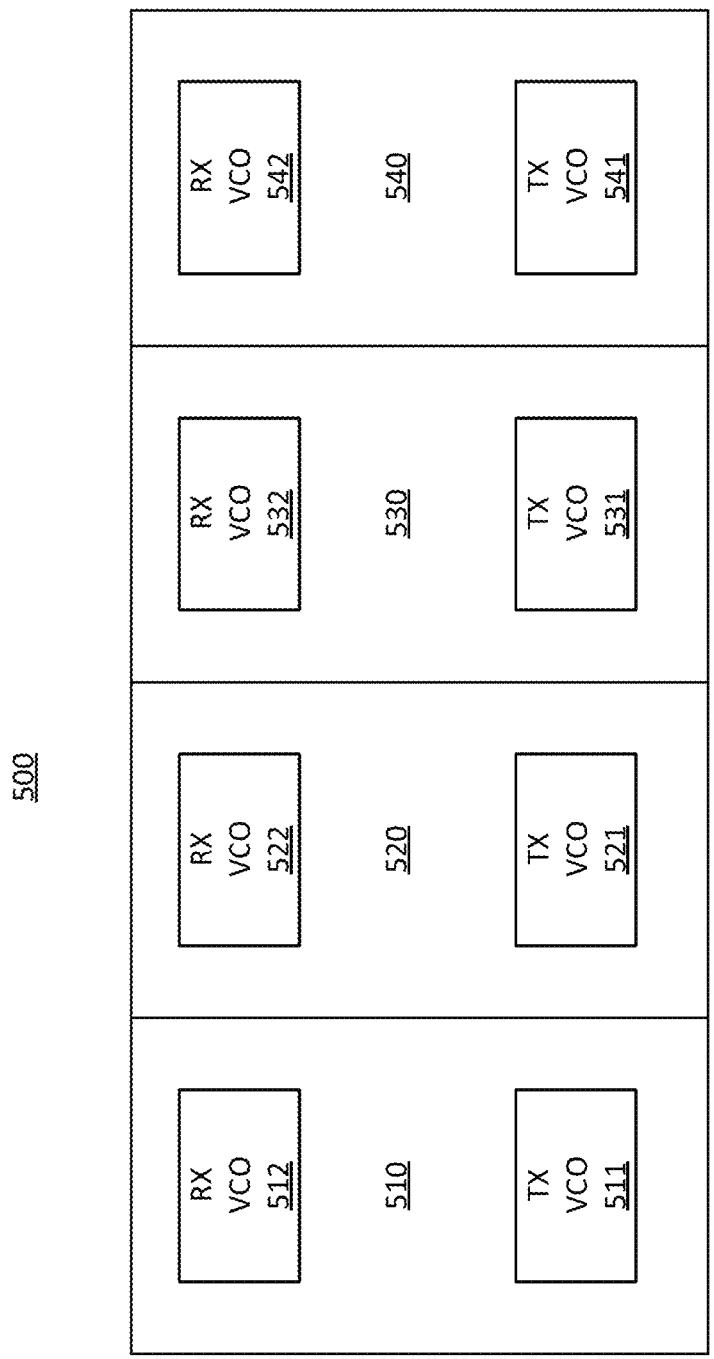
FIG. 5 is a block diagram illustrating a communication array 500 that incorporate inductors according to embodiments of the present invention.

FIG. 5 is a block diagram illustrating a communication array 500 that incorporate inductors according to embodiments of the present invention. This diagram is merely an example, which should not unduly limit the scope of the claims. One of ordinary skill in the art would recognize many variations, alternatives, and modifications. Communication array 500, as shown, includes SerDes 510-540. For example, the communication array 500 includes multiple communication interfaces for as inputs and outputs for SerDes 510-540. For example, SerDes 510-540 may be implemented with a configuration that is similar to SerDes 400. SerDes 510 includes, among other components, a receiver VCO 512 and a transmitter VCO 511. For example, VCO 512 and VCO 511 both include compensated inductors according to embodiments of the present invention. Similarly, SerDes 520-540 include their own receiver and transmitter VCOs, and these VCOs are implemented with compensated inductors according to embodiments of the present invention.

Figure 6:
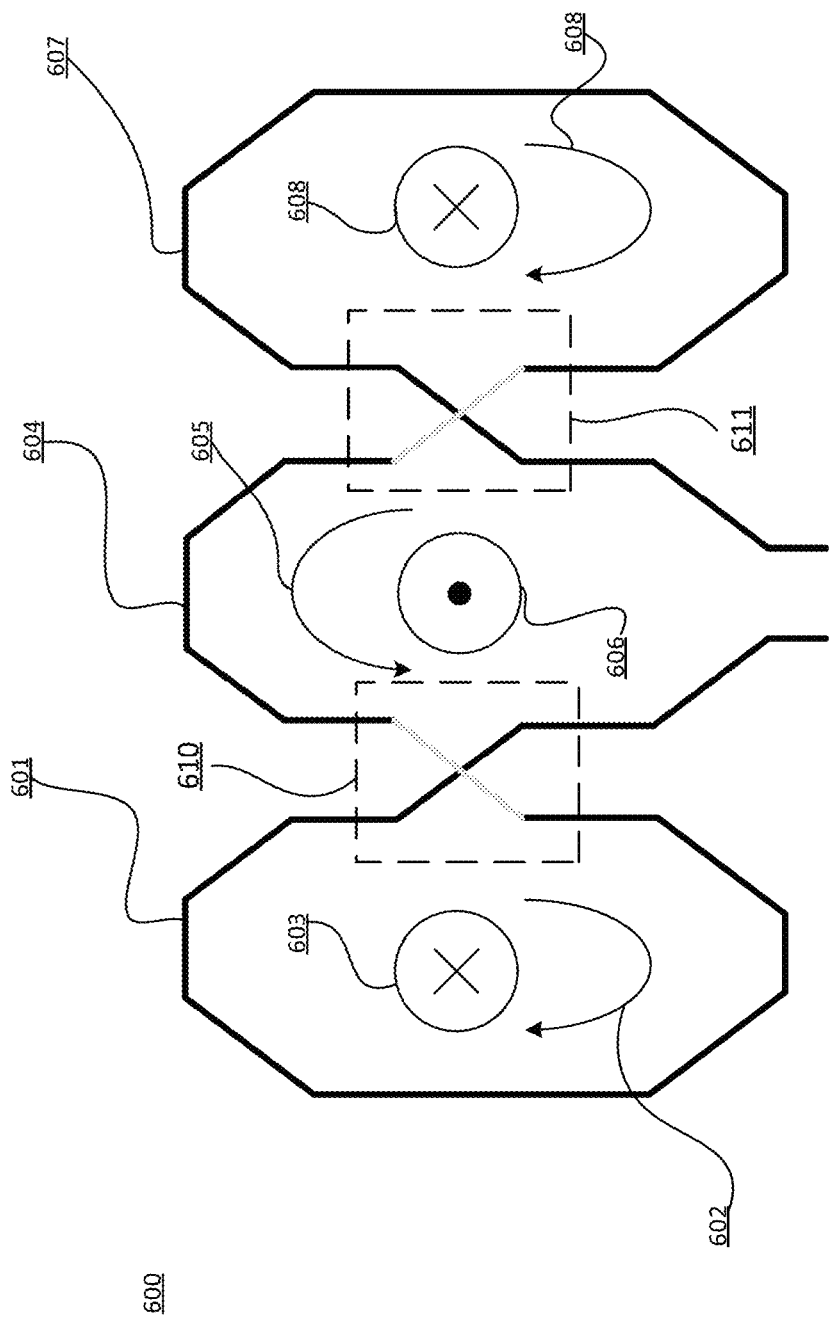
FIG. 6 is a simplified diagram illustrating operation of an inductor 600 according to embodiments of the present invention.

FIG. 6 is a simplified diagram illustrating operation of an inductor 600 according to embodiments of the present invention. This diagram is merely an example, which should not unduly limit the scope of the claims. One of ordinary skill in the art would recognize many variations, alternatives, and modifications. Inductor 600 is configured as an array of three coils 601, 604, and 607. For example, the sizes of these three coils are similar (and can be substantially equal in certain implementations) for the purpose of EM field cancellation, as the EM generated by current flowing through these coils is based largely attributed to coil size (assume the same current flows through these three coils). As can be seen, the three coils are formed by a continuous conductive line, and to have different directions for current flow, coils are connected to each other with crossover regions (e.g., exemplary conductor strip overlapping is described above). Coil 601 and coil 604 share a crossover region 610, which allows the current flow directions of the two coils to be opposite relative to each other. For example, current flows along a counterclockwise direction 605 for coil 604. Following the right hand-rule, the direction EM field vector for coil 604 is "out of the paper", denoted by the dot 606 as shown. By way of cross section 610, current flows along a clockwise direction 602 for coil 601, and based on the right-hand rule, the direction of EM field vector for coil 601 is "into the paper", denoted by the cross 603 as shown. Similarly, through cross section 611, current flows along a clockwise direction 608 for coil 607. For coil 607, the direction of EM is "into the paper", also denoted by cross 608 as shown. It is to be noted that two adjacent coils have EM fields in opposite directions. For example, the EM field vector of coil 601 is "into the paper", which is opposite to the EM field of coil 604, which is "out of paper". An intended effect of this configuration is for EM fields of coils 601 and 604 cancel each other. The EM field vector of coil 607 is also opposite of the EM field of coil 604, and these two EM fields cancel each other.

The overall EM field of inductor 600, which is the sum of EM fields of the three coils as shown, is specifically arranged to be close to zero, thereby minimizing EM interference attributed of inductor 600 when the inductor is implemented into devices and systems. The EM field of inductor 600 largely depends on the relative sizes of the three coils arranged as an array. It is to be understood while the three coils in FIG. 6 are shown to have similar size, there can be different implementations where three (or more) coils each have different size and shape, and the net EM field of the inductor is non-zero but small enough for intended applications.

Figure 7A:
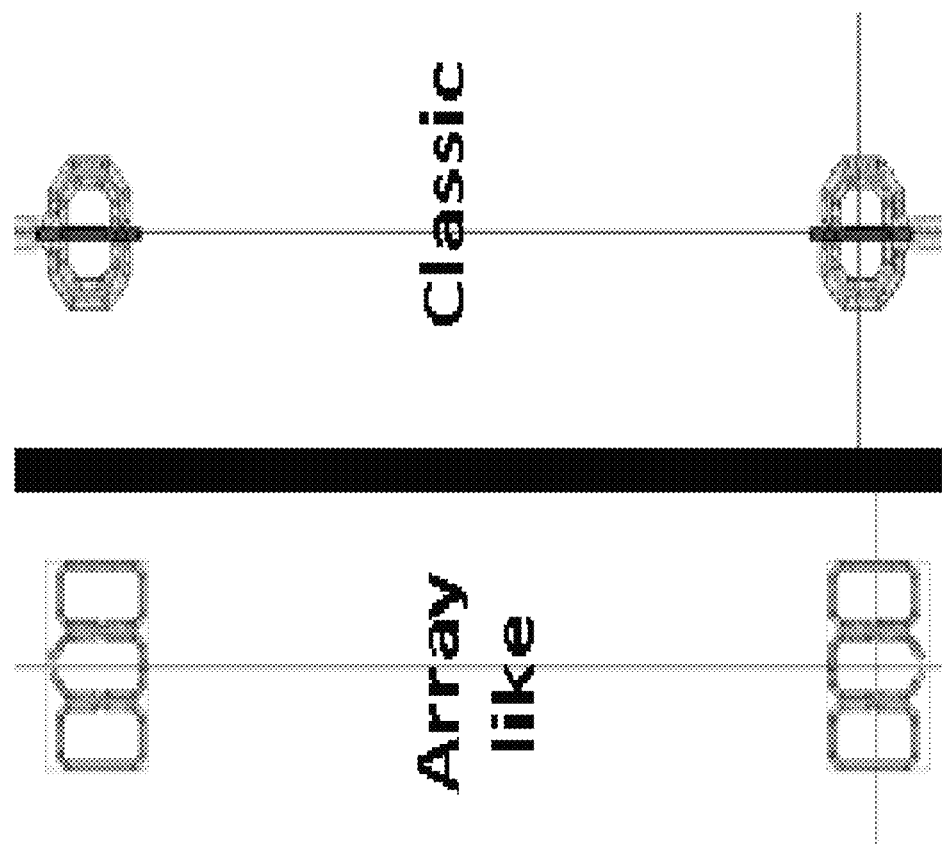
FIG. 7A is a diagram comparing a conventional inductor with an "array-like" inductor according to an embodiment of the present invention.
Figure 7B:
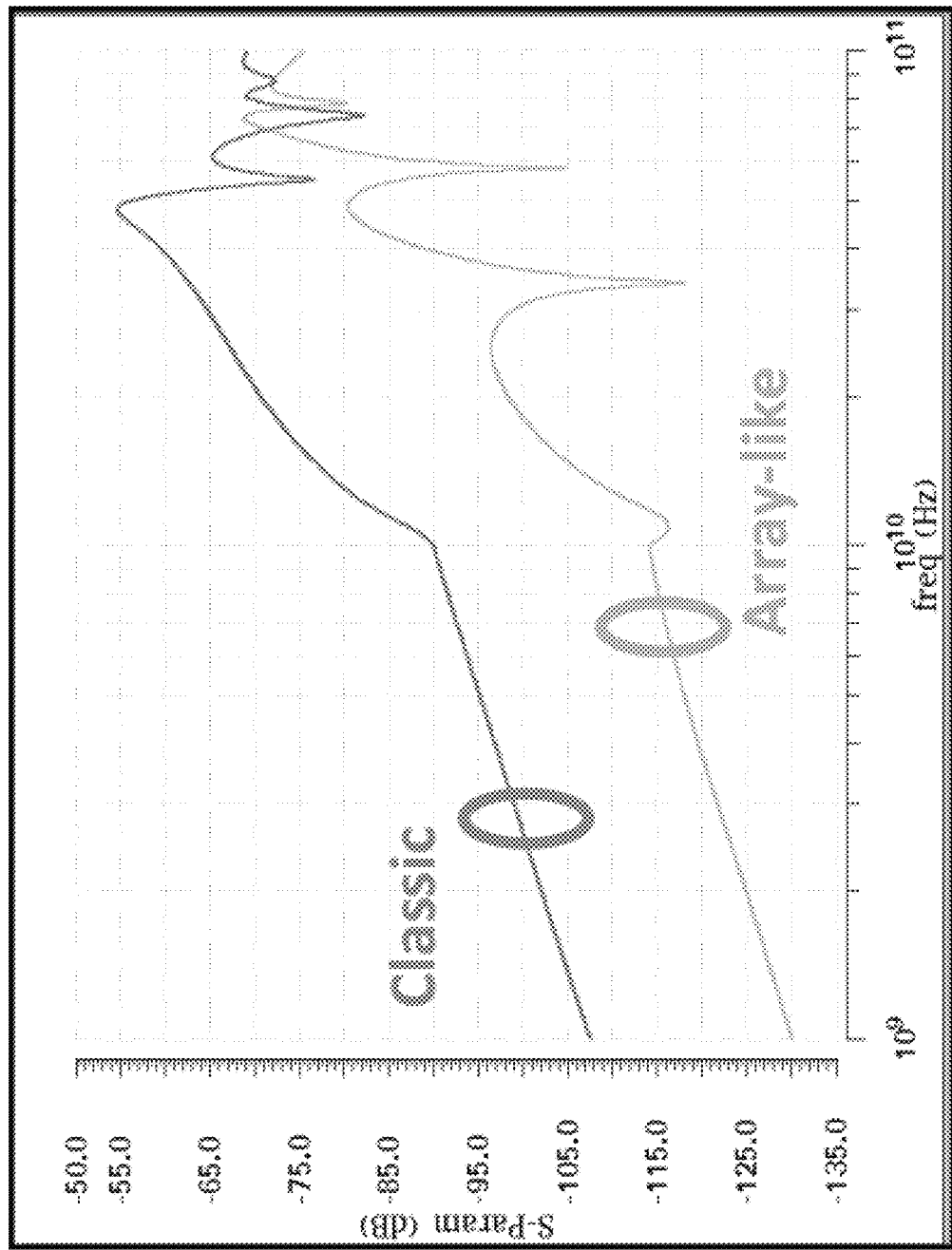
FIG. 7B is a graph comparing performance of a conventional inductor with an "array-like" inductor.

FIG. 7A is a diagram comparing a conventional inductor with an "array-like" inductor according to an embodiment of the present invention. This diagram is merely an example, which should not unduly limit the scope of the claims. One of ordinary skill in the art would recognize many variations, alternatives, and modifications. The left side of FIG. 7A shows an array-like inductor structure according to embodiments of the present invention, and in comparison, the right side of FIG. 7A shows a conventional inductor configuration, wherein inductor coils form a concentric ring. FIG. 7B is a graph comparing performance of a conventional inductor against the performance of an "array-like" inductor. In FIG. 7B, the amount of undesirable EM interference is characterized by the parameter, S-Param (measured in dB), on the y-axis, and the frequency is on the x-axis. As can be seen, the array-like configuration of coils provides a much lower EM interference (e.g., 20 dB at $10^9$ Hz).

FIG. 8 is a simplified diagram illustrating an inductor circuit 900 with an inner loop according to embodiments of the present invention. This diagram is merely an example, which should not unduly limit the scope of the claims. One of ordinary skill in the art would recognize many variations, alternatives, and modifications. Inductor circuit 900 is implemented with four coils 901-904. And these four coils are connected to each at crossover regions 905-907. Coil 903 is configured inside coil 902. Depending on the implementation, coil 902 and coil 903 can be substantially concentric for efficient EM cancellation. Coil 902 and coil 903 are connected to each other at crossover section 906. At the crossover section 906, changes relative direction of current flow; for example, if current flows in a clockwise direction at coil 902, after passing through section 906, the current flows in a counterclockwise direction at coil 903, thereby generating EM fields (EM vectors based on right-hand rule) at opposite directions, which allow for EM cancellation, between coil 902 and coil 903. In various embodiments, multiple concentric coils can be arranged crossover connections (similar to section 906) to allow for EM cancellation.

Coil 901 is connected to coil 902 at section 905. The crossover at section 905 allows current flow at different directions for coil 901 and coil 902, thus allows for cancellation of EM fields attributed to coil 901 and coil 902. Similarly, coil 904 is connected to coil 902 at section 907. The crossover at section 907 allows current flow at different directions for coil 904 and coil 902, thus allows for cancellation of EM fields attributed to coil 904 and coil 902. The sizes of coils 901-904 are different, and so are the sizes of their respective EM fields when the same current flow through these coils. Depending on the implementation, the total EM fields of coils 901-904 may be zero or substantially close to zero (or forming an accumulative dipole). In certain embodiments, the combined EM fields 901-904 may be set at a predetermined amount.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. An electronic circuit comprising:
a transmitter;
a first inductor connected to the transmitter, the first inductor comprising:
a main coil configured to direct a current in a first direction to generate a first electromagnetic field, the main coil comprising:
a first winding configured to direct the current in the first direction, and
a second winding connected in series to the first winding, the second winding configured to direct the current in the first direction;
a first side coil coupled to the main coil at a first side, the first side coil configured to direct the current in a second direction to generate a second electromagnetic field; and
a second side coil couple to the main coil at a second side, opposite to the first side, the first side coil configured to direct the current in the second direction to generate a third electromagnetic field;
a fourth coil coupled to the first coil with a crossover connection, the first coil and the fourth coil being substantially concentric, the first coil and the fourth coil being characterized by substantially opposite electromagnetic filed directions;
a receiver; and a second inductor connected to the receiver, wherein the second inductor is electromagnetically coupled to the first inductor.

2. The electronic circuit of claim 1, wherein the second electromagnetic field and the third electromagnetic field substantially cancels the first electromagnetic field in a region determined based on a location of the second inductor.

3. The electronic circuit of claim 1, wherein the first winding comprises one or more metal traces in a first metal layer, and the second winding comprises one or more metal traces in the first metal layer, and wherein the one or more metal traces of the first winding surrounds the one or more metal traces of the second winding.

4. The electronic circuit of claim 1, wherein the first winding has an area larger than the second winding.

5. A serializer/deserializer (SerDes) apparatus comprising:
 a transmitter section; and
 a receiver section, the receiver section comprising:
  an input terminal configured for receiving an input data stream;
  an equalizer configured for equalizing the input data stream;
  a sampler configured for generating a sampled data stream using the equalized data stream and a first clock signal; and
  a first voltage-controlled oscillator (VCO) configured for generating the first clock signal, the first VCO comprising a first inductor including a first array of coils, the first array of coils including a first coil and a second coil, the first coil and the second coil being coupled to each with a first crossover connection, the first coil and the second coil being characterized by substantially opposite electromagnetic field directions, the first coil and the second coil being substantially concentric.

6. The SerDes apparatus of claim 5 wherein the receiver section further comprising a decision-feedback equalizer configured to process the sampled data stream.

7. The SerDes apparatus of claim 5 wherein the transmitter device comprises:
 a finite impulse response filter configured to filter an output data stream;
 a serializer configured to generate a driver signal using the filter output data stream and a second clock signal;
 a driver configured for generating an output data signal using the driving signal and the second clock signal;
 a second VCO configured for generating the second clock signal, the second VCO comprising a d second inductor including a second array of coil.

8. The SerDes apparatus of claim 7 wherein the second array of coil comprises a third coil and a fourth coil, the third coil and the third coil being coupled to each with a second crossover connection, the third coil and the fourth coil being characterized by substantially opposite electromagnetic field directions.

9. The SerDes apparatus of claim 5 wherein the first array of coils further comprising a third coil, the third coil being coupled to the second coil with a second crossover connection.

10. A serializer/deserializer (SerDes) apparatus comprising:
 a transmitter section, the transmitter section comprising:
  a finite impulse response filter configured to filter an output data stream;
  a serializer configured to generate a driver signal using the filter output data stream and a second clock signal;
  a driver configured for generating an output data signal using the driving signal and the second clock signal;
  a second VCO configured for generating the second clock signal, the second VCO comprising a second inductor including a second array of coil; and
 a receiver section, the receiver section comprising:
  an input terminal configured for receiving an input data stream;
  an equalizer configured for equalizing the input data stream;
  a sampler configured for generating a sampled data stream using the equalized data stream and a first clock signal; and
  a first voltage-controlled oscillator (VCO) configured for generating the first clock signal, the first VCO comprising a first inductor including a first array of coils, the first array of coils including a first coil and a second coil, the first coil and the second coil being coupled to each with a first crossover connection, the first coil and the second coil being characterized by substantially opposite electromagnetic field directions.

11. The SerDes apparatus of claim 10 wherein the second array of coil comprises a third coil and a fourth coil, the third coil and the third coil being coupled to each with a second crossover connection, the third coil and the fourth coil being characterized by substantially opposite electromagnetic field directions.

12. The SerDes apparatus of claim 10 wherein the first array of coils further comprising a third coil, the third coil being coupled to the second coil with a second crossover connection.

13. The SerDes apparatus of claim 10 wherein the first coil and the second coil are substantially concentric.

* * * * *